United States Patent [19]

Baliga et al.

[11] Patent Number: 4,663,547
[45] Date of Patent: May 5, 1987

[54] COMPOSITE CIRCUIT FOR POWER SEMICONDUCTOR SWITCHING

[75] Inventors: Bantval J. Baliga, Clifton Park; Michael S. Adler, Schenectady, both of N.Y.

[73] Assignee: General Electric Company, Schenectady, N.Y.

[21] Appl. No.: 257,080

[22] Filed: Apr. 24, 1981

[51] Int. Cl.⁴ .................. H03K 17/72; H03K 17/56
[52] U.S. Cl. ................. 307/570; 307/252 R; 307/304; 307/305; 307/571
[58] Field of Search ............. 307/248, 250, 252 R, 307/252 A, 252 J, 304, 305, 570, 571, 581

[56] References Cited

U.S. PATENT DOCUMENTS

| | | | |
|---|---|---|---|
| 3,268,776 | 8/1966 | Reed | 307/252 J |
| 3,614,474 | 10/1971 | Hahn | 307/305 |
| 3,916,222 | 10/1975 | Compton | 307/570 |
| 4,107,725 | 8/1978 | Yoshida et al. | 307/581 |
| 4,354,121 | 10/1982 | Terasawa et al. | 307/252 C |

OTHER PUBLICATIONS

S. C. Sun et al., "Modeling of the On-Resistance of LDMOS, VDMOS and VMOS Power Transistors", IEEE Transactions on Electron Devices, vol. ED-27, No. 2, Feb., 1980, pp. 356-367.
J. Homola & A. G. Milnes, "Turn-Off-Type Field-Controlled Thyristor Concepts for High Power Operation", Solid-State Electronics, vol. 23, (1980), pp. 1101-1105.
B. Jayant Baliga, "The Asymmetrical Field-Controlled Thyristor", IEEE Transactions on Electron Devices, vol. ED-27, No. 7, Jul. 1980, pp. 1262-1268.
B. Jayant Baliga, "A Power Junction Gate Field-Effect Transistor Structure with High Blocking Gain", IEEE Transactions on Electron Devices, vol. ED-27, No. 2, (Feb. 1980), pp. 368-373.

Primary Examiner—John Zazworsky
Attorney, Agent, or Firm—Marvin Snyder; James C. Davis, Jr.

[57] ABSTRACT

A solid state composite control circuit includes a normally-off gating device connected in series with a normally-on high voltage semiconductor device so that the combination operates as a normally-off high power semiconductor device. The control device is a low voltage semiconductor device, which can switch rapidly with very low gate turn-off current during turn-off of the composite circuit. In a particular example, a low voltage, normally-off, MOSFET is connected in series with the cathode of a high voltage, normally-on FCT. In another example, a low voltage, normally-off, MOSFET is connected in series with the source of a high voltage, normally-on JFET. The composite circuit has a very high turn-off gain as well as high dv/dt and di/dt capability.

2 Claims, 11 Drawing Figures $V_G$ @ 5V/cm
$I_G$ @ 50mA/cm
$I_A$ @ 0.5A/cm
$V_A$ @ 10V/cm $t_1$ $t_2$  $t_3$  $t_4$ $V_G$ @ 5V/cm
$I_G$ @ 50mA/cm
$I_A$ @ 0.5A/cm
$V_A$ @ 10 V/cm $t_1$ $t_2$  $t_3$  $t_4$

COMPOSITE CIRCUIT FOR POWER SEMICONDUCTOR SWITCHING

BACKGROUND OF THE INVENTION

This invention relates to power field effect semiconductor devices and control circuits utilizing such devices, and more particularly, to circuits and methods for controlling normally-on semiconductor devices so that they can be operated in a normally-off mode.

Prior art field controlled thyristors have been developed for power switching applications. These devices can block current flow for both polarities of applied anode voltage, and can also conduct forward current with a low forward voltage drop. These devices have also been shown to exhibit gate turnoff capability with turn-off times of less than 1 microsecond. To obtain forward blocking characteristics in this device, it is necessary to apply a negative bias to the gate. This negative bias reverse biases the gate junction and causes a depletion layer to extend under the cathode. When the depletion layers of adjacent gate regions punch through under the cathode, a potential barrier is formed between the anode and the cathode. This potential barrier prevents the injection of electrons from the cathode to the anode and, thus, allows the device to block the current flow. However, as the anode voltage increases, the potential barrier height decreases. When the anode voltage is increased beyond a certain value for each applied gate bias voltage, anode current flow will commence. The ratio of the anode voltage to the applied gate bias is defined as a blocking gain of the device. Thus, the field controlled thyristor has a normally-on characteristic and requires the application of a gate voltage to maintain it in the off state.

Field controlled thyristors can be switched rapidly from the conducting mode to the forward blocking mode by the application of a negative gate voltage while the anode current is flowing. During gate turn-off, sufficient gate current must be supplied by the gate drive circuit so as to remove the minority carrier stored charge in the n-base and to allow the gate depletion layer to extend under the cathode to pinch off the anode current flow. It has been found that turn-off times of less than 1 microsecond can be achieved when the peak gate turn-off current is comparable to the anode current.

A conventional prior art circuit used for gating field controlled thyristors (FCT) is shown in FIG. 1. In circuit 10, current supply to the load 12 by the power supply 14 can be controlled by gating the field controlled thyristor 16 using a switch 18. When switch 18 is open, FCT 16 is in its on state and the current is supplied to the load 12. When the shown schematically by 20 and 22, is used to maintain the FCT in its forward blocking mode. The turn-off speed of the FCT is controlled by the peak gate current during turn-off. This current can be controlled by the gate resistance 22. Several problems have been encountered with the use of this gating circuit. First, the devices are normally-on in the absence of a gate bias voltage, and the circuits cannot ensure fail-safe start-up and operation. Second, the devices require a substantial gate voltage in order to operate them at large forward blocking voltages. This problem has been partially overcome in the prior art by improvements in the device structure, which have allowed the development of devices with high blocking gains. In spite of improvements of blocking gain, some gate bias voltage is necessary to maintain these devices in their forward blocking mode. Third, these devices require substantial gate drive currents to switch them from the on state to the blocking state. Thus, although turn-off times of a few microseconds have been observed, gate turn-off current gains of less than 5 are typically necessary to achieve these high turn-off speeds. These drawbacks of the field controlled thyristors have been primarily responsible for its limited application to power switching applications.

SUMMARY OF THE INVENTION

An object of the instant invention is to provide a circuit configuration including a high breakdown voltage normally-on power device connected in series with a low breakdown voltage normally-off power device such that the circuit can be operated in a normally-off mode; the turn-on and turn-off of the circuit is controlled by controlling the low voltage power device. It is a second object of the instant invention to provide a high voltage normally-off device configuration which exhibits fast gate turn-off with a very high gate turn-off gain.

Accordingly, the instant invention describes a composite circuit including a high voltage normally-on device connected in series with a low voltage, normally-off transistor such that the low voltage, normally-off transistor controls current flow through the composite circuit. In one embodiment, the instant invention includes a field controlled thyristor having in series with the cathode thereof a low voltage MOSFET. An alternative preferred embodiment includes a junction field effect transistor, JFET, having a low voltage MOSFET connected in series with the source of the JFET. In further preferred embodiments, a low voltage bipolar transistor is connected in series with the cathode of a high voltage field controlled thyristor or the source of a high voltage JFET.

BRIEF DESCRIPTION OF THE DRAWINGS

The features of the invention believed to be novel and unobvious over the prior art are set forth with particularity in the appended claims. The invention itself, including organization and method of operation, together with further objects and advantages thereof, may best be understood by reference to the following description taken in conjunction with the accompanying drawings in which:

DESCRIPTION OF THE PREFERRED EMBODIMENTS

Figure 2:
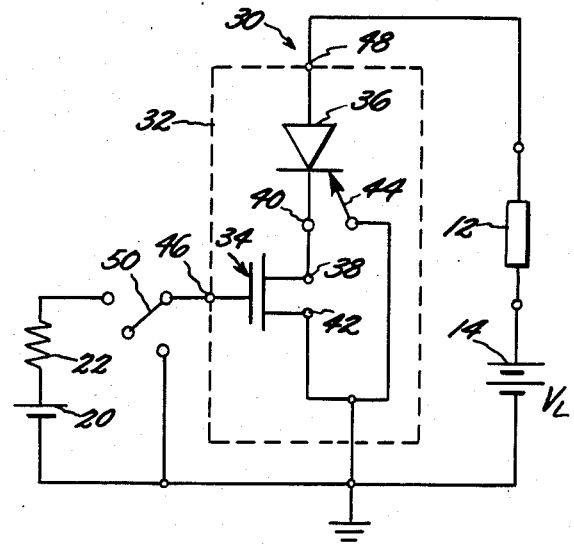
FIG. 2 is a schematic circuit diagram showing one preferred embodiment of the instant invention.

The problems discussed above in the conventional gating technique for field controlled thyristors can be solved by using the new gating circuits discussed herein. In each of the embodiments described herein, a high voltage normally-on device is caused to operate in a normally-off mode by adding a low voltage normally-off device in series with the high voltage device. A gating circuit 30 employing our instant invention is shown in FIG. 2. In the composite circuit 32, an n channel, normally-off, MOS gated field effect transistor 34 is used to control the current flow through the normally-on field controlled thyristor 36. As used herein, "normally-on" means a device which conducts current in the absence of gate bias and requires a gate bias to block current flow. As used herein, "normally-off" means a device which blocks current in the absence of gate bias and conducts current when gate bias is applied. As used herein, "high voltage" is a voltage of 100 volts or greater and "low voltage" is a voltage less than 100 volts. To accomplish this, the drain 38 of the MOSFET 34 is connected to the cathode 40 of the FCT 36 and the source 42 of the MOSFET is connected to the gate 44 of the FCT. The current conduction through the load 12 is then controlled by the bias applied to the gate 46 of the MOSFET 34.

The circuit in FIG. 2 operates as follows: with no gate bias applied to the MOSFET, the composite circuit 32 cannot conduct current, because voltage is supported across the gate junction of the FCT. If the load voltage VL is applied, the MOSFET 34 remains in its off state and does not allow current flow between its drain 38 and source 42 terminals. The breakdown voltage of the MOSFET should be sufficiently high to avoid avalanche breakdown, as described hereinafter. The application of the positive voltage to the anode 48 of the FCT reverse biases its gate junction. The depletion layer of the gate junction then spreads under the cathode of the FCT and establishes a potential barrier between the anode and the cathode. This process shields the cathode potential from the anode potential. When a positive voltage is applied to the MOSFET gate 46 with respect to the cathode which is at ground potential, the MOSFET turns on. This short-circuits the gate 44 of the FCT to the cathode 40. This now allows current flow from the anode to the cathode, since the potential barrier is removed. This current flows through the MOSFET 34 to the cathode terminal 40. In order to deliver current to the load, the switch 50 is used to connect the gate 46 to the positive gate power supply 20. This positive gate bias must exceed the threshold voltage of the MOSFET 34 in order to switch it to the conducting state. When the MOSFET is in its conducting state, the load current can now flow through the FCT from the anode to the cathode and via the drain of the MOSFET to the ground terminal. Thus, as mentioned earlier, in this circuit the full load current flows through the MOSFET.

Figure 6:
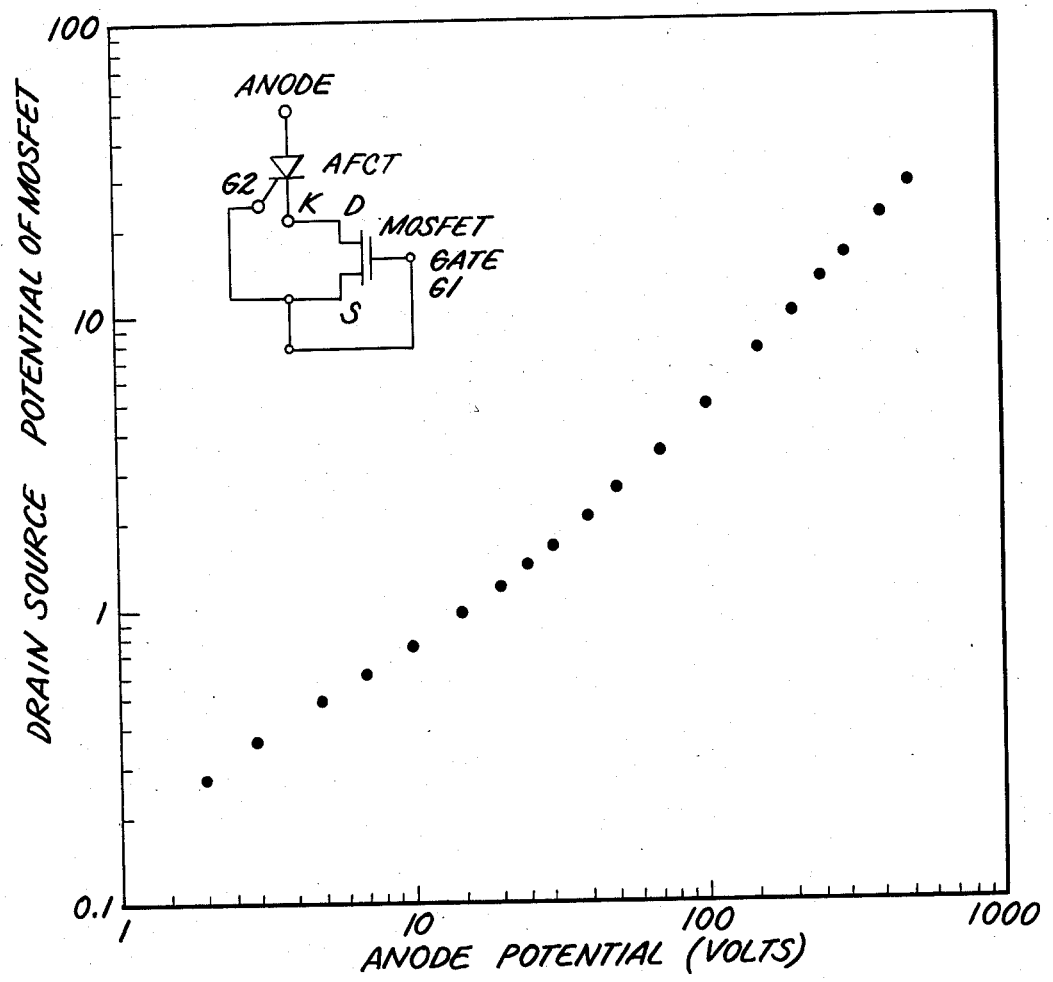
FIG. 6 is a graph schematically illustrating a characteristic of the embodiment of FIG. 2.

The operating characteristics of the circuit 30 are schematically illustrated in FIG. 6, which shows a plot of the measured FCT gate cathode potential,(equivalent to the drain to source potential of the MOSFET) as a function of the applied anode voltage. It can be observed that the drain-source voltage of the MOSFET remains at less than 50 volts for an anode voltage over 600 volts. This feature is extremely important for operation of the circuit because it allows the use of a low breakdown voltage MOSFET device for controlling the load current. These low voltage MOSFETs can be designed with a low on-resistance, so that power dissipation in the MOSFET in the on condition is low. Thus, although the full FCT current must pass through the MOSFET when it is turned on, the voltage across the MOSFET is small, so that a low breakdown voltage MOSFET can be used here. A typical FCT forward voltage drop is about 1.5 volts and a typical MOSFET voltage drop is less than 0.5 volts to obtain an overall forward drop in the circuit of about 2.0 volts.

Figure 1:
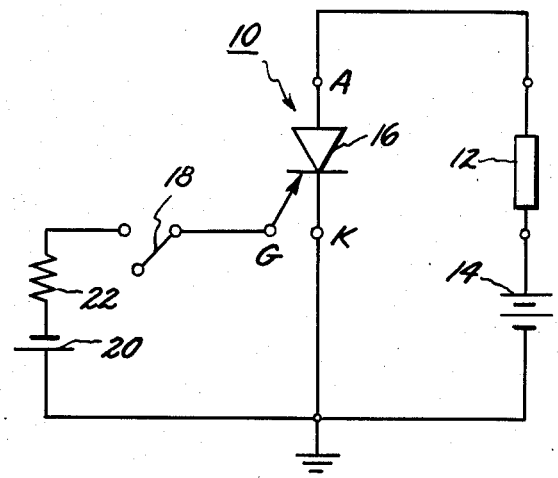
FIG. 1 is a schematic circuit diagram showing a prior art technique for controlling a high voltage field controlled thyristor.

The gating circuit shown in FIG. 2 has the additional advantage of achieving forced gate turn-off of the anode current with a very high gate turn-off current gain. In order to turn off the load current, the switch 50 is used to connect the gate 46 of the MOSFET to ground potential. When this is done, the MOSFET switches from its conducting state to its blocking state. In order to accomplish this, a displacement current must flow to discharge the input capacitance of the MOSFET. Once the MOSFET turns off, its drain potential rises. This produces a reverse bias on the gate junction of the FCT. The minority carriers stored in the n-base of the FCT are then removed via the gate 44 until the FCT 36 becomes reverse biased and starts blocking anode voltage. The current flowing out of the gate is equal to the anode current of the FCT until the gate junction begins to support the anode voltage. Any remaining charge will decay by recombination. This process is similar to reverse recovery process in a p-i-n rectifier. Thus, removal of the stored charge in the FCT occurs under conditions similar to unity current gain turn-off for the conventional circuit shown in FIG. 1. As discussed in the introduction, this has been observed to ensure very rapid turn-off of the FCT. However, in the new gating circuit shown in FIG. 2, the gate drive current required during turn-off is determined by the displacement current required for discharging the gate capacitance of the MOSFET. Thus, in this gating scheme, a very low gate drive current is used to charge and discharge the MOSFET gate capacitance while turning on and off large anode currents. Thus, the new gate circuit offers very high gate turn-off current gains at very fast turn-off speeds. In dynamic circuit operation, the current flow through the composite device is obtained by applying a gate voltage at the desired time to turn on the MOSFET. When this current is to be stopped, the gate bias is removed. Consequently, these devices exhibit a large current gain for turn-on and turn-off. Further, in the steady-state bias condition (either on or off state) no gate drive current is needed.

Figure 3:
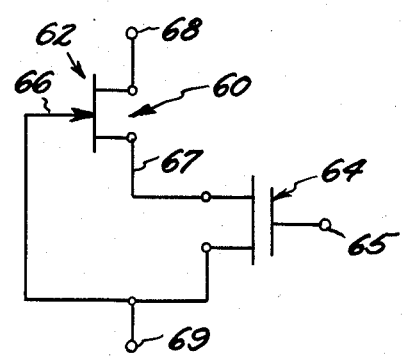
FIG. 3 is a schematic circuit diagram illustrating an alternative preferred embodiment of the instant invention.

An alternative embodiment of the instant invention is shown in FIG. 3. In this embodiment, a high voltage, normally-on junction field effect transistor 62 is connected to a low voltage MOSFET 64, as shown. The operation of the circuit 60 for the JFET 62 is similar to that described above for the FCT. When no gate bias is applied to the MOSFET 64, the circuit 60 cannot conduct current, because voltage is supported across the gate 66 of the JFET 62. The application of a positive voltage to the drain 68 of the JFET reverse biases its gate 66. When a positive voltage is applied to the MOSFET gate 65 with respect to the source 69, the MOSFET turns on. This short circuits the gate 66 of the JFET to the source 67. This allows current flow from the source 67 to the drain 68, since the potential barrier has been removed. This source-to-drain current flows through the MOSFET 64 to the source terminal 69. When gate bias is removed from the MOSFET, the device current is blocked, as described above relative to FIG. 2.

Figure 4:
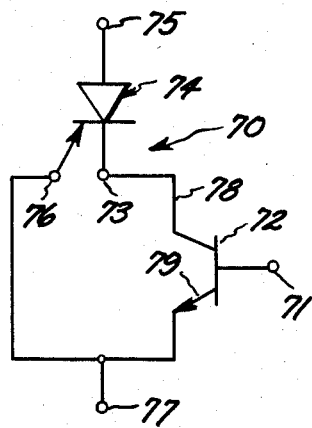
FIG. 4 is a schematic circuit diagram illustrating another preferred embodiment of the instant invention.

A further embodiment of the instant invention employs a composite circuit 70 in which a low voltage bipolar transistor 72 is employed to control a high voltage normally-on field controlled thyristor 74 as shown in FIG. 4. In this configuration the collector 78 of the bipolar transistor is connected to the cathode 73 of the field controlled thyristor and emitter 79 of the bipolar transistor is connected to the gate 76 of the field controlled thyristor. The on/off state of the combination is controlled by a gate current applied to the gate 71 of the bipolar transistor 72.

The circuit of FIG. 4 operates as follows: with no gate current applied to the bipolar transistor gate 71, the composite circuit 70 cannot conduct/current, because voltage is supported across the gate junction of the FCT 74. If a load voltage is applied, transistor 72 remains in its off state and does not allow current flow between its collector 78 and emitter 79. The breakdown voltage of the transistor 72 should be chosen sufficiently high to avoid avalanche breakdown, as discussed previously. The application of the positive voltage to anode 75 of the FCT 74 reverse biases its gate junction, as described above relative to FIG. 2. When a positive voltage is applied to the gate 71 of transistor 72, the transistor 72 turns on. This short circuits the gate 76 of the FCT 74 to the cathode 73. The potential barrier between the anode and cathode of FCT 74 is removed and current flow occurs between anode 75 and terminal 77. In order to turn off the composite circuit 70, gate 71 of transistor 72 is connected to ground potential, which switches transistor 72 from its conducting to its blocking state, and the collector potential rises. This produces a reverse bias on the gate junction of FCT 74. Minority carriers stored in the n-base of the FCT are then removed via gate 76 until FCT 74 becomes reverse biased and starts blocking anode voltage. Thus, a very low gate drive current is used to turn on and turn off large anode currents.

Figure 5:
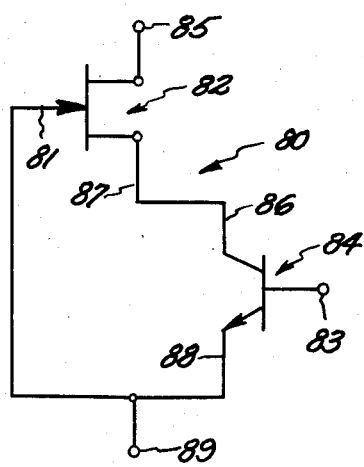
FIG. 5 is a schematic circuit diagram illustrating yet another preferred embodiment of the instant invention.

Yet another embodiment of the instant invention is shown in FIG. 5, in which the composite circuit 80 comprises a JFET 82 connected in series with a bipolar transistor 84. Current control through the composite circuit 80 is obtained by controlling the gate current applied to the bipolar transistor 84. When no current is applied to gate 83 of transistor 84 no current flows between the collector 86 and emitter 88, the circuit 80 cannot conduct current, because voltage is supported across the gate 81 of JFET 82. The application of positive voltage to drain 85 of JFET 82 reverse biases its gate 81. When current is applied to gate 83 of transistor 84, the transistor 84 turns on, short-circuiting the gate 81 to source 87 of the JFET 82. Current can now flow from source 87 to drain 85, since the potential barrier has been removed. This source to drain current flows through transistor 84 to terxinal 89. Turn-off can be achieved by removal of the gate current as described above.

As a specific example, a 10 ampere FCT, which can operate up to 1,000 volts with a forward voltage drop of 1.5 volts during forward conduction at a current density of 300 amperes per square centimeter and a MOSFET able to carry 50 amps at a forward voltage drop of 0.5 volts and operate at a breakdown voltage of less than 50 volts were connected in series. Such an arrangement can be made of a combination of separate FCT and MOSFET devices or as an integrated device as described in U.S. patent application Ser. No. 212,181, filed Dec. 2, 1980.

Figure 7:
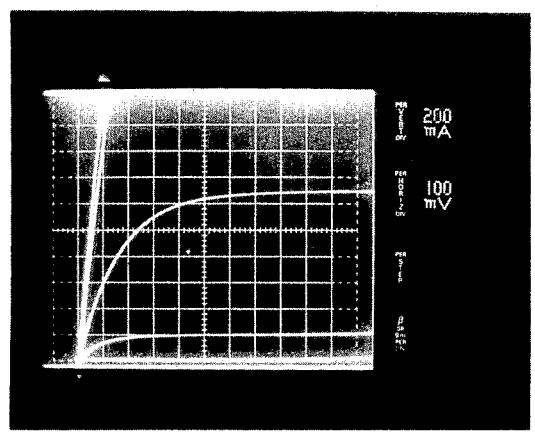
FIG. 7 illustrates the characteristics of a MOSFET.
Figure 8:
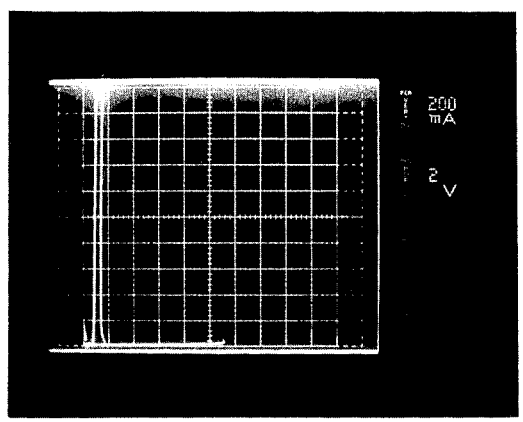
FIG. 8 illustrates typical characteristics of a field controlled thyristor.
Figure 9:
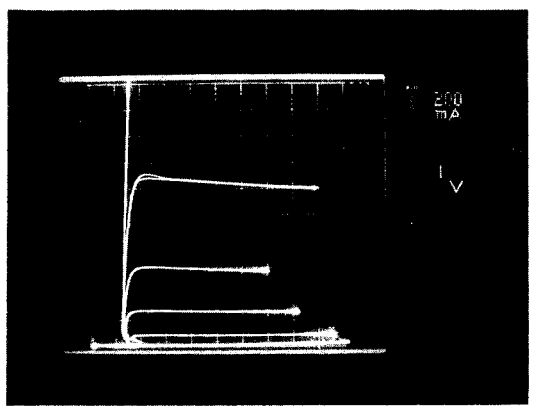
FIG. 9 illustrates the characteristics of the composite circuit illustrated in FIG. 2.

The characteristics of the composite FCT MOSFET circuit were measured using a curve tracer and are shown in FIG. 9. These characteristics were obtained by applying gate bias voltages of +5, +3.8, +3.4 and +3.2 volts to obtain the displayed characteristics. At the lower gate voltages, the MOSFET current saturates producing the observed saturation in the composite device characteristics. This can be observed in the MOSFET characteristics shown in FIG. 7 taken with similar gate bias voltages. At larger gate voltages (e.g., +5 volts) the characteristic follows the FCT characteristics obtained with the gate of the FCT shorted to the cathode of the FCT. This characteristic is shown in FIG. 8. Thus, the composite circuit has the expected terminal characteristic.

Figure 10:
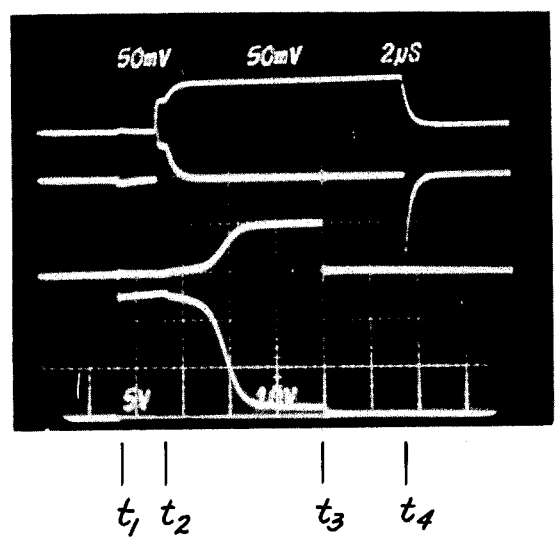
FIGS. 10 and 11 illustrate switching characteristics of a composite AFCT and MOSFET circuit.

Gate turn-on and turn-off measurements were also done using the composite circuit shown in FIG. 2. Typical wave forms are as shown in FIG. 10. It can be seen that when the anode voltage is initially applied at time $t_1$, no anode current flows until the 5 volt gate bias is applied at time $t_2$. The composite structure then allows anode cathode current flow until time $t_3$. At time $t_3$, the anode voltage is turned off and the current abruptly falls to zero. The gate voltage is turned off at time $t_4$. This demonstrates turn-off due to anode voltage being switched off.

Figure 11:
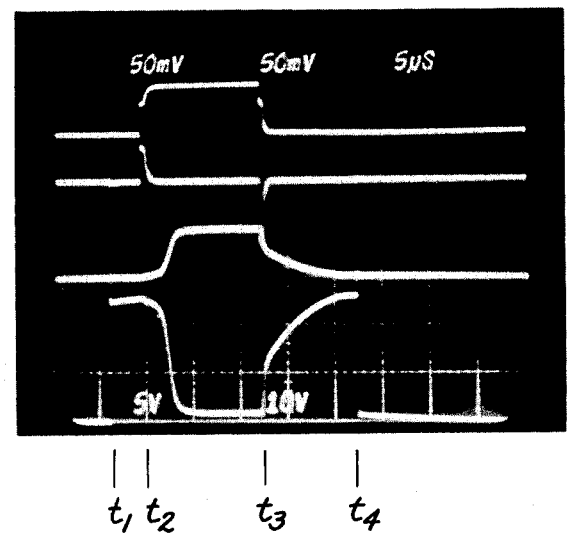

The device can also be turned off by switching off the gate voltage to the MOSFET while anode current is flowing. This is demonstrated in FIG. 11. At time $t_1$, the anode voltage is applied followed by application of the gate bias at time $t_2$. The anode current begins to flow at time $t_2$. At time $t_3$, the gate bias voltage is switched off. The MOSFET now turns off. The anode current then drops adruptly from 0.5 amps to about 0.25 amps. The anode voltage simultaneously rises from about 1.5 volts to about 12 volts. At this point, the gate of the FCT is reverse biased. The remaining stored charge in the base of the FCT then decays by recombination producing a decay in the anode current to zero in about 7 microseconds. The anode voltage is turned off later at time $t_4$. It is worth pointing out that during both turn-on and turn-off, peak gate currents of less than 0.1 amp are observed for anode currents of up to 2 amperes. The gate turn-off gain is thus greater than 20 for the circuit of this invention.

As shown above, the instant invention provides the ability to conduct large current with low forward voltage drop, the ability to block large anode voltage when using low voltage MOSFET devices for gating the high voltage device, the ability to turn-on and turn-off anode current with gate bias applied to the MOSFET and high turn-on and turn-off gains.

We claim:
1. A composite control circuit comprising:
   a high voltage normally-on field controlled thyristor having an anode, a cathode and a gate, a potential barrier between said anode and said cathode precluding conduction by said field controlled thyristor when said anode is biased positive with respect to said gate; and
   a low voltage normally-off field effect transistor having a source terminal, a drain terminal and a gate terminal, said cathode of said field controlled thyristor being connected to said drain terminal of said field effect transistor, said gate of said field controlled thyristor being connected to said source terminal of said field effect transistor;

said field effect transistor short-circuiting said gate to said cathode so as to remove said potential barrier and permit anode-to-cathode current flow in said thyristor in response to application of a voltage signal to said gate terminal of sufficient amplitude to render conductive said low voltage field effect transistor.

2. A composite control circuit comprising:

a high voltage normally-on field controlled thyristor having an anode, a cathode and a gate, a potential barrier between said anode and said cathode precluding conduction by said field controlled thyristor when said anode is biased positive with respect to said gate; and a low voltage normally-off bipolar transistor having an emitter terminal, a collector terminal and a base terminal; said cathode of said field controlled thyristor being connected to said collector terminal of said bipolar transistor, said gate of said field controlled thyristor being connected to said emitter terminal of said bipolar transistor;

said bipolar transistor short-circuiting said gate to said cathode so as to remove said potential barrier and permit anode-to-cathode current flow in said thyristor in response to a current signal applied to said base terminal of sufficient amplitude to render conductive said bipolar transistor.

* * * * *